United States Patent [19]

Reed

[11] Patent Number: 5,065,055

[45] Date of Patent: Nov. 12, 1991

[54] METHOD AND APPARATUS FOR HIGH-SPEED BI-CMOS DIFFERENTIAL AMPLIFIER WITH CONTROLLED OUTPUT VOLTAGE SWING

[75] Inventor: John Reed, Los Altos, Calif.

[73] Assignee: Sun Microsystems, Inc., Mountain View, Calif.

[21] Appl. No.: 632,937

[22] Filed: Dec. 20, 1990

[51] Int. Cl.[5] ........ H03F 3/45

[52] U.S. Cl. ........ 307/530; 307/296.1

[58] Field of Search ........ 307/296.1, 296.4, 296.7, 307/530; 330/252, 261, 300

[56] References Cited

U.S. PATENT DOCUMENTS 4,939,693 7/1990 Tran ........ 307/530

*Primary Examiner*—Steven Mottola

*Attorney, Agent, or Firm*—Blakely Sokoloff Taylor & Zafman

[57] ABSTRACT

The present invention provides apparatus and methods to achieve a high speed bi-CMOS differential amplifier with controlled output voltage swing for use in amplifying low level complementary logic signals. The differential amplifier is comprised of a load current controller and a sense amplifier. The load current controller compares a desired reference voltage to the voltage drop across a simulated load. The load current controller then produces therefrom a bias voltage corresponding to the current which results in a voltage drop equal to the reference voltage. The bias voltage, when applied to the sense amplifier, limits the output of the sense amplifier to a controlled voltage swing of magnitude equal to the reference voltage.

35 Claims, 4 Drawing Sheets

METHOD AND APPARATUS FOR HIGH-SPEED BI-CMOS DIFFERENTIAL AMPLIFIER WITH CONTROLLED OUTPUT VOLTAGE SWING

BACKGROUND OF THE INVENTION

1. Field of the Invention

The present invention relates to apparatus and methods for a bi-CMOS differential amplifier, and more particularly to a high speed bi-CMOS differential amplifier with controlled output voltage swing for use with low level complementary logic signals.

2. Art Background

Differential amplifiers are commonly used in bi-level signal processing, wherein the magnitude of one signal is compared to the magnitude of another, and the output determined by the difference between the two signals. For MOSFET constructions, including bi-CMOS constructions, a common method of optimizing the differential amplifier for a particular application is to drive a current through a resistive load. Referring to FIG. 1*a*, a differential amplifier 115 is shown, formed by a pair of bipolar transistors 110 and 111, with current supplied by a current source 112. The output of differential amplifier 115 is equal to the voltage difference across a pair of resistive loads 100 and 101 connected to each bipolar transistor 110 and 111 forming differential amplifier 115. Resistive loads 100 and 101 are chosen such that the voltage drop across each produces a voltage difference which is appropriate for the particular parameters of the circuit elements which follow differential amplifier 115.

Although the resistive load matching circuit shown in FIG. 1*a* works well for many applications, the design falters when applied to high speed logic processing. There are two predominant performance problems associated with the above-mentioned resistive load configuration. First, if the voltage swing across either resistive load 100 or 101 is too large, then either transistor 110 or 111 connected to the load can be driven into saturation, i.e., the collector-base junction becomes forward biased. Once the transistor has saturated, turning the transistor off requires more time, and therefore will retard the performance of the differential amplifier.

Secondly, although the excessive voltage swing can be reduced through the use of voltage clamps, the solution itself induces another problem. Referring now to FIG. 1*b*, a differential amplifier 165 is formed by a pair of bipolar transistors 160 and 161, with current supplied by a current source 162. As shown in FIG. 1*b*, the swing voltage of differential amplifier 165 is reduced through the use of a pair of bipolar clamps 150 and 151 limiting the output of loads 140 and 141 driven by transistors 160 and 161 respectively. However, the presence of clamps 150 and 151 in and of themselves increases the capacitance on the output nodes. If the capacitance is too high, the time response to time-varying signals is increased which again results in a slowing of the response for that output node, and therefore retards the overall performance of differential amplifier 165. As suggested above, both the saturation and capacitance conditions cause significant problems in a circuit where speed is crucial.

Moreover, depending on the particular application, the physical size of the resistive load can result in a slowing of circuit performance. Typically, a resistor in a MOSFET device is formed as a base-diffusion transistor operating within the linear response region of its associated I-V characteristic. As such a base-diffusion resistor is physically layed out on the silicon substrate, the intrinsic capacitance of the resistive device increases with increasing physical size of the device. The increased capacitance of the device results in slowing the response of the node. At some point, the slowing can render the amplifier useless for high or very high speed applications.

Another prior art solution to the differential amplifier optimization problem is to use an active feedback mechanism to relate differential amplifier output voltage to the reference voltage source. Although this solution can provide more precise output voltage control, active feedback can be inappropriate when applied to high speed circuits. In very high speed logic circuits, the mere measurement of the output node can raise the node capacitance to appreciably slow the performance of the node, and thereby slow the performance of the entire differential amplifier.

SUMMARY OF THE INVENTION

It is an object of the present invention to provide a simple and effective apparatus for, and method of, controlling the output voltage swing of one or more bi-CMOS differential amplifiers for use in high speed logic signal processing, without slowing the response of the differential amplifier. The present invention also provides an apparatus for, and method of, optimizing the output voltage swing of a such a bi-CMOS differential amplifier which is more effective across a range of temperature and voltage conditions than prior art apparatus and methods, but which does not slow the performance of the differential amplifier in high speed applications.

A differential amplifier with controlled voltage swing for use in high speed logic circuits is disclosed. The differential amplifier is comprised of a load current control circuit which controls the output swing of one or more controlled differential sense amplifiers. The load current controller operates by measuring the voltage drop in a simulated load device, the simulated load device being scaled geometrically so that it presents the same load to the controller as the actual load presents to the sense amplifier. The balance of the simulated load path duplicates exactly the circuit path within the output node of the sense amplifier, as will be described in more detail below. Notably, the load current controller is itself configured as a differential amplifier, which compares the voltage drop across the simulated load device to a desired swing voltage reference. The output of the differential amplifier contained within the load current controller therefore is the difference between the actual voltage drop across the simulated load device and the swing voltage which is desired. The voltage difference then drives a current mirror which sources a current which is scaled to a particularly desired predetermined value. The scaled current subsequently flows into a transistor configured as a voltage clamp, whose clamped output is a voltage denominated as $V_{bias}$. $V_{bias}$ is the voltage which causes a current to flow in the simulated load corresponding to a voltage drop equal to the reference or desired swing voltage.

The sense amplifiers are conventionally configured differential amplifier pairs, each comprised of two bipolar transistors, whose base inputs are complementary logic signals received from a memory array column-select amplifier. The collector of each transistor of the differential pair is connected to a p-channel MOSFET load acting as a linear resistor, thereby producing the respective logic complementary output signals. The $V_{bias}$ voltage supplied by the load current control circuit permits the load currents flowing in the p-channel "resistor" to be precisely controlled, the controller driving a current source which is connected in common to the emitters of the transistors forming the differential pair of each sense amplifier. The current source driven by $V_{bias}$ in operation biases the differential pair within each sense amplifier such that the voltage swing measured at the output of each collector of the differential amplifier is equal to the desired swing voltage developed by the load current control circuit. Thus, the output swing of the differential amplifier is controlled by the load current control circuit to a specified range, while not compromising speed. The advantages to be gained by a differential amplifier employing the present invention are improved control of amplifier output at higher speeds and across a broader range of operating and processing temperatures and voltages than permitted by prior art designs.

BRIEF DESCRIPTION OF THE DRAWINGS

The objects, features and advantages of the present invention will be apparent from the following detailed description in which.

DETAILED DESCRIPTION OF THE INVENTION

A high speed bi-CMOS differential amplifier with controlled voltage swing is disclosed. In the following description, for purposes of explanation, specific numbers, times, signals, signal timing, architectures, etc. are set forth in order to provide a thorough understanding of the present invention. However, it will be apparent to one skilled in the art that the present invention may be practiced without these specific details. In other instances, well known circuits and devices are shown in block diagram form in order not to obscure the present invention unnecessarily.

Figure 1A:
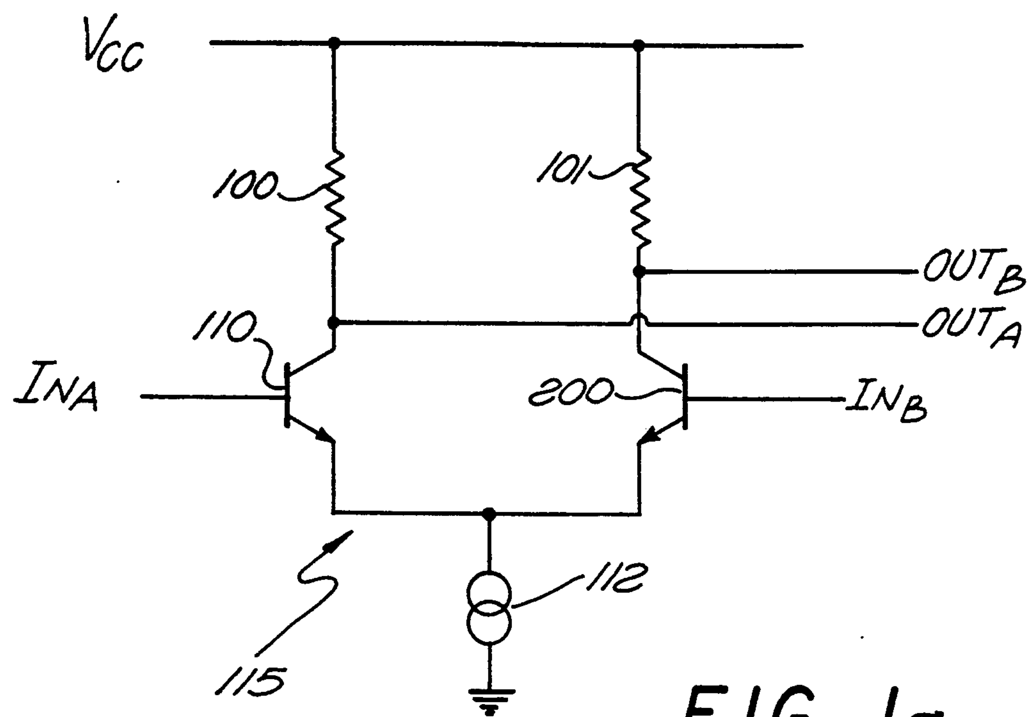
FIGS. 1*a* and 1*b* illustrate the prior art solutions to the optimization of differential amplifier output to a particular load.
Figure 1B:
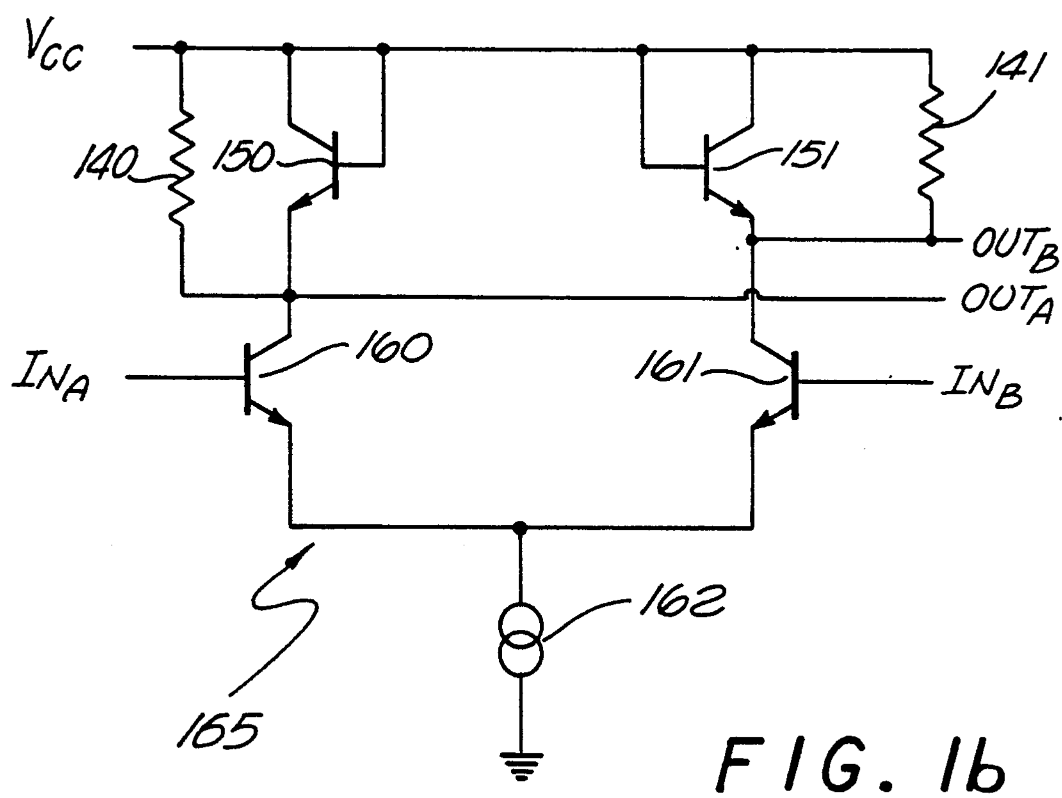
Figure 2A:
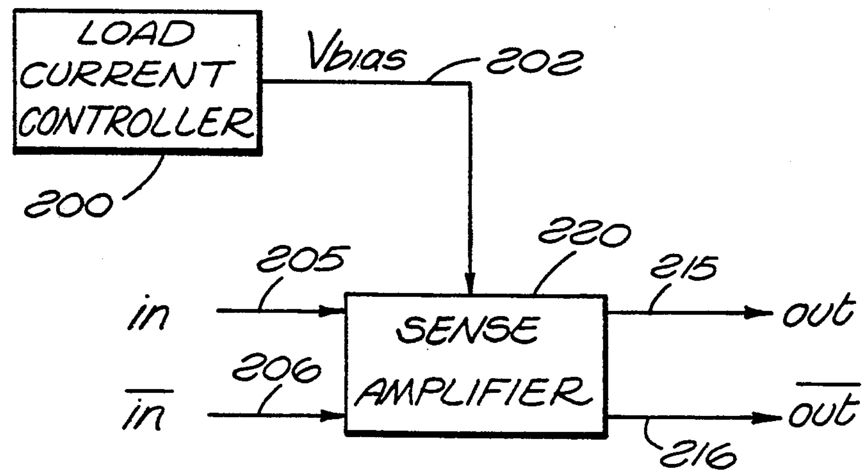
FIG. 2*a* illustrates the present invention using a load current controller to limit the output swing of a sense amplifier.

Referring now to FIG. 2*a*, a simplified block diagram of the differential amplifier which is the subject of the present invention is shown. In FIG. 2*a*, a load current controller 200 produces a bias voltage 204, which is supplied to a sense amplifier 220. Sense amplifier 220 has a pair of inputs 205 and 206, each receiving one of two low-level complementary logic signals. Sense amplifier 220 further has a pair of outputs 215 and 216 for each of two amplified complementary logic signals. In operation, sense amplifier 220 increases the voltage levels of the signals coupled to inputs 205 and 206. Bias voltage 204 serves to limit the amplification of input signals 205 and 206 by sense amplifier 220, so that the voltage swing of outputs 215 and 216 remains within a predetermined desired range. It should be obvious to one skilled in the art that, although FIG. 2*a* shows one load current controller 200 coupled to one sense amplifier 220, a plurality of sense amplifier 220 may be coupled to a single load current controller 200, with equally valid results.

Figure 2B:
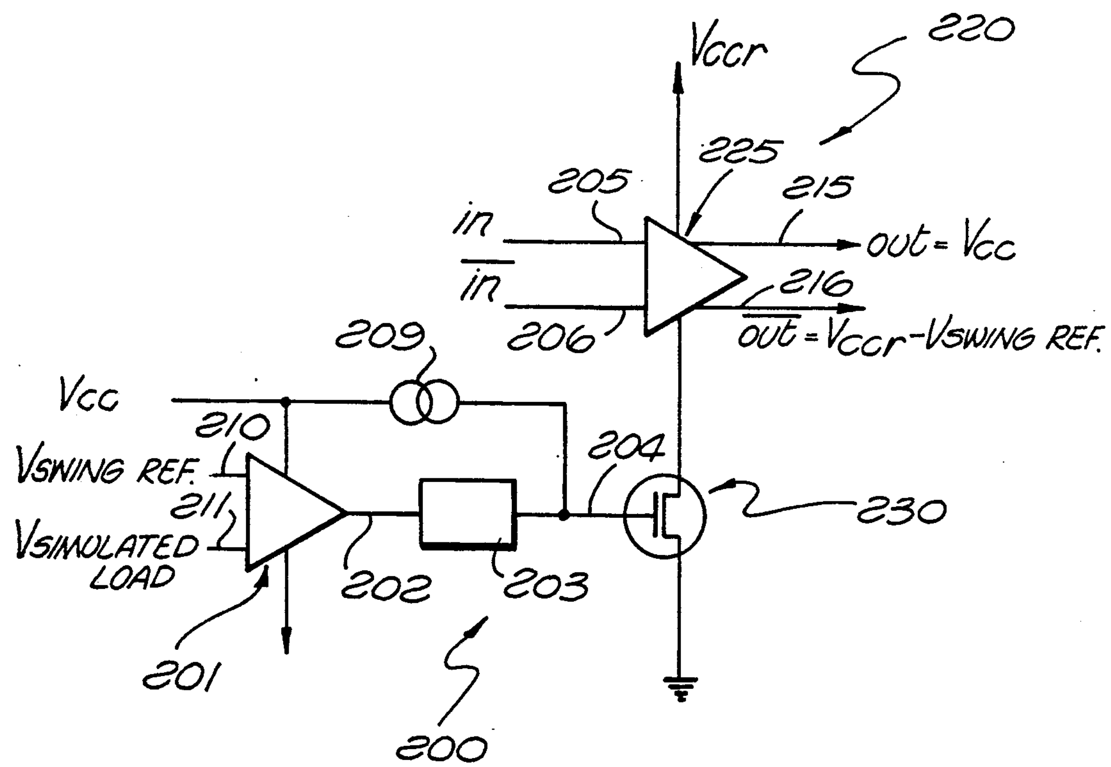
FIG. 2*b* is a more detailed diagramatic representation of the load current controller, and representative input and output signals.

Turning now to FIG. 2*b*, a more detailed diagrammatic representation of the present invention is shown. Load current controller 200 is comprised of a differential amplifier 201 having two inputs. One input receives a voltage from a reference voltage source 210, which voltage is to be the output swing voltage of sense amplifier 220. The other input receives the voltage drop as measured across a simulated load device 211. Differential amplifier 201 compares the simulated load voltage 211 against the reference voltage 210 and produces therefrom an output 202, with output 202 determined by the difference between two input signals 210 and 211. Output voltage 202 is subsequently limited by a voltage clamp 203. The output of clamp 203 is a voltage denominated as the bias voltage $V_{bias}$ 204. A current source 209 then supplies the current for output bias voltage 204.

Still referring to FIG. 2*b*, sense amplifier 220 is configured as shown previously in FIG. 2*a*. In FIG. 2*b*, differential amplifier 225 receives inputs 205 and 206, inputs 205 and 206 comprising one of two complementary logic signals. Sense amplifier 220 further has a pair of outputs 215 and 216, each outputting one of two amplified complementary logic signals. Bias voltage 204 is connected to differential amplifier 225 through a current source 230. In operation, sense amplifier 220 increases the voltage levels of input signals 205 and 206, bias voltage 204 serving to limit differential amplifier 225 such that the voltage swing of outputs 215 and 216 remains within a predetermined range. As shown in FIG. 2*b*, in the present embodiment of the invention, outputs 215 and 216 will swing between the circuit supply voltage and circuit supply minus the swing reference voltage.

Figure 3:
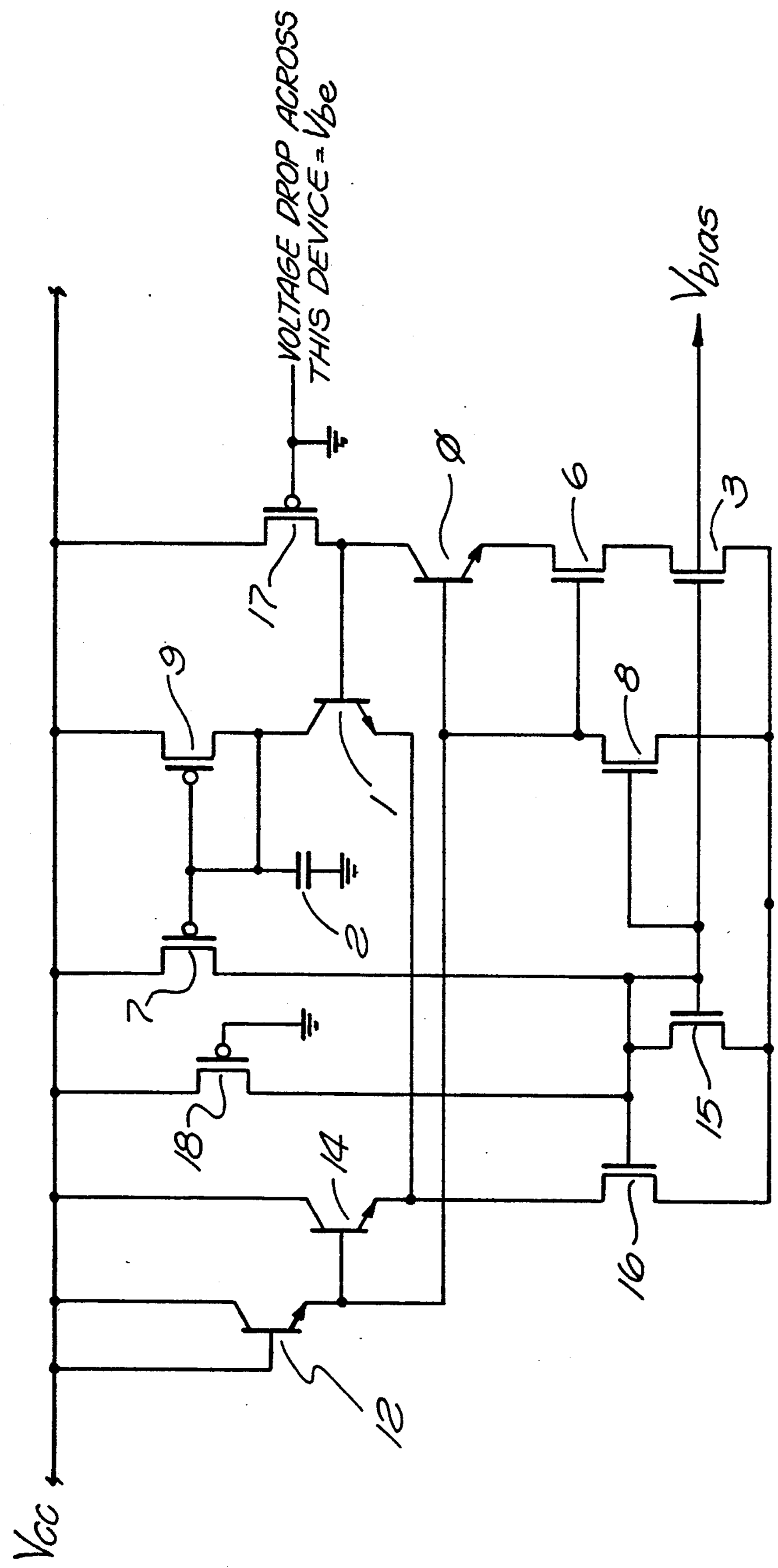
FIG. 3 is a schematic representation of the load current control circuit of the present invention.

Reference is now made to FIG. 3, which is a schematic of the load current control circuit providing an output bias voltage $V_{bias}$. Throughout FIG. 3, $V_{cc}$ is the common-node supply voltage for the circuit. Within the load current controller is a pair of emitter-coupled bipolar npn transistors 1 and 14 which operate as a differential pair. An n-channel MOSFET transistor 16 acts as a current source for transistors 1 and 14 forming the differential pair, and is connected in common with the emitters of transistors 1 and 14. A desired reference swing voltage is provided by npn bipolar transistor 12, wherein the reference voltage is the base-emitter voltage $V_{be}$ of transistor 12, transistor 12 having its collector and base tied to $V_{cc}$. The $V_{be}$ of transistor 12 was used as a reference level in the disclosed embodiment because it was desired to control the differential amplifier output swing to $V_{be}$, a known, relatively stable quantity. However, any desired output swing could be obtained by setting the reference level to other voltage levels by techniques well-known in the art.

Reference voltage $V_{be}$ is taken from the emitter of transistor 12, and is coupled to one input of the differential pair via the base of transistor 14. The collector of transistor 14 is tied to $V_{cc}$. The input to the other transistor of the differential pair is the voltage drop across a simulated load device formed by transistor 17. In the preferred embodiment, transistor 17 forming the simulated load device is a p-channel MOSFET transistor of dimension 3.5/0.8 micron, configured to operate in the fashion of a linear resistor. It must be noted that transistor 17 is geometrically scaled to match the output device within the sense amplifier, which will discussed in more detail in connection with FIG. 4. The source of transistor 17 is connected to $V_{cc}$ and the gate grounded, with the drain connected to the base of transistor 1, thus comprising the other input to the differential pair formed by transistors 1 and 14. The remainder of the simulated load circuit path following transistor 17 forming the simulated load device is precisely analogous, and is functionally identical, to the output path within the sense amplifier block to be discussed below.

The drain of transistor 17 comprises a simulated load device and is connected to the collector of an npn bipolar transistor 0. As stated above transistor 0 is functionally identical to each of the bipolar transistors forming the differential amplifier within the sense amplifier, although transistor 0 is a lower current device. The base of transistor 0 receives the $V_{be}$ reference supplied by the emitter of transistor 12. The emitter of transistor 0 is connected to the drain of an n-channel MOSFET transistor 6, whose source in turn is connected to the drain of another n-channel MOSFET transistor 3, whose source is tied to ground. Transistors 17, 0, 6 and 3 are, as above, functionally identical to four transistors within the sense amplifier block to be discussed below in connection with FIG. 4. Transistors 17, 0, 6 and 3, present the load current controller with an identical circuit load as the sense amplifier because the voltage level $V_{cc}-V_{be}$ is approximately in the same level which is applied to the base of the corresponding transistor in the differential amplifier whose swing is being controlled.

As a circuit path, transistor 17, transistor 0, transistor 6, and transistor 3 represent functionally the conducting path of the differential amplifier contained within the sense amplifier block. The intention here is to simulate the current flow through the path, monitor the current flow through transistor 17 forming the p-channel simulated load at the top of the path, compare the voltage drop across transistor 17 against the $V_{be}$ voltage of reference transistor 12, and adjust an output voltage $V_{bias}$ that is representative of the operating conditions when the compared voltages are in balance. It must be noted that, although the circuit path is functionally identical to the output stage of the actual sense amplifier, the devices contained within the load current controller are scaled duplicates only. Thus, although the voltages at representative nodes are the same, the magnitude of the current within the simulated path is much smaller, and requires only a minimal current supply in comparison with the sense amplifier. The purpose of the functionally similar circuit path is a key feature of the present invention, for it permits the controller to produce a controlling bias voltage without intrusively measuring parameter values within the sense amplifier itself.

Still referring to FIG. 3, the collector of transistor 1 drives a current mirror, comprised of a pair of p-channel MOSFET transistors 7 and 9, wherein the collector of transistor 1 is connected to the drain of transistor 9, and is further connected to the gates of both transistor 9 and transistor 7. The sources of transistors 7 and 9 are tied to a circuit supply $V_{cc}$. In the preferred embodiment, transistor 9 has a channel width of 3 microns, and transistor 7 has a channel width of 5 microns, thus yielding a current flowing through transistor 7 which is 5/3 the current flowing in transistor 9. The drain of transistor 7 is connected to a voltage clamp 15, which is formed by a transistor having its gate and drain tied together to the drain of transistor 7, and the source of transistor 15 tied to ground. A p-channel MOSFET biasing transistor 18 permits the circuit to begin operating. Transistor 18 has its source tied to $V_{cc}$ and its gate grounded. The drain of transistor 18 is tied to the gate of transistor 16, and the drain of voltage clamp transistor 15.

In operation, and especially in starting up from a rest condition, biasing transistor 18 raises the voltage on its drain so as to turn on transistor 3. Transistor 3 thus permits a current to flow in the simulated load path formed by transistor 3, transistor 6, transistor 0 and transistor 17. The voltage level on $V_{bias}$ continues to rise to a point where a significant amount of current flows through bipolar transistor 0. Transistor 0 pulls down the voltage on its collector on the drain of transistor 17, and also on the base of bipolar transistor 1. The voltage on the base of transistor 1 comes down to a point where it reaches a balance with the voltage on the base of transistor 14. Transistor 14, from above, has impressed on its base the reference voltage $V_{be}$ from transistor 12. Thus, the differential pair formed by transistors 14 and 1 begins to reach its controlling point. The current flow through transistor 1 also flows through transistor 9. Noted from above, transistor 9 together with transistor 7 form a current mirror, and therefore the current flowing through transistor 9 is duplicated in transistor 7. The only difference between the two currents is a scaling produced by the ratio of the sizes of the geometries of transistors 9 and 7 as explained above. In the present embodiment, the current scaling comprises a ratio of 5/3. The current flowing through transistor 7 flows in transistor 15 configured as a voltage clamp, transistor 15 limiting the voltage on the drain of transistor 7. As limited by transistor 15, the voltage at the drain of transistor 7 is precisely the desired bias voltage $V_{bias}$, which is that voltage which is representative of the condition where the voltage drop across simulated load transistor 17 is equal to $V_{be}$, which is the desired output voltage swing referenced by transistor 12. $V_{bias}$ is the output of the load current controller; as will be evident to one skilled in the art, the negative feedback provided by the "closed-loop" control circuit tends to keep $V_{bias}$ at that level which provides just enough current through transistor 17 to equalize the base voltages of transistors 1 and 14. At this $V_{bias}$ level, therefore, the corresponding voltage swing on the collectors of the differential amplifiers will be approximately $V_{be}$. $V_{bias}$ is connected to the $V_{bias}$ input of the sense amplifier, which will be now described.

Figure 4:
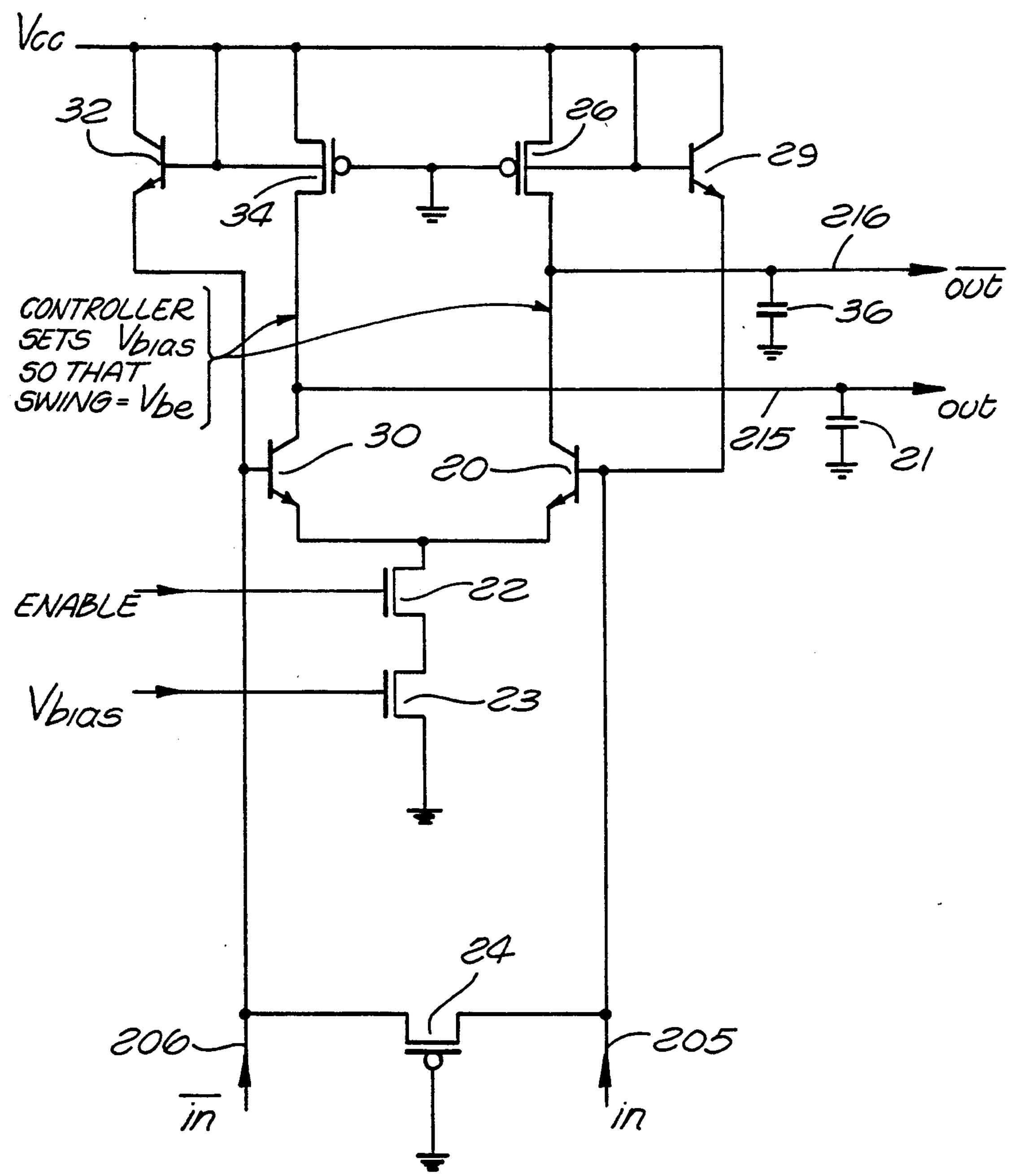
FIG. 4 is a schematic representation of the sense amplifier contained within the present invention.

Turning now to FIG. 4, a schematic of the sense amplifier is shown. As in FIG. 3 above, $V_{cc}$ is the common-node supply voltage. The sense amplifier is comprised of a bipolar differential amplifier as is well known in the field, being formed by npn bipolar transistor 20 and npn bipolar transistor 30. The emitters of transistors 20 and 30 are coupled in common to ground via a pair of n-channel MOSFET transistors 22 and 23. Transistor 22 acts essentially as an enable switch, with its drain tied to the coupled emitters of transistors 20 and 30, its source connected to the drain of transistor 23, and its gate receiving the enable signal from an external control means (not shown). Transistor 23 operates as a current source for the $V_{bias}$ voltage supply to the differential pair, its source tied to ground, and its gate receiving the $V_{bias}$ voltage from the load current controller. The collector of transistor 20 is connected to the source of a p-channel load device transistor 26, operating as a linear resistor with the drain of transistor 26 tied to $V_{cc}$. The collector of transistor 30 is connected to the source of a p-channel load device transistor 34, transistor 34 also operating as a linear resistor with the drain of transistor 34 tied to $V_{cc}$. The gates of transistors 26 and 34 are tied together to ground, completing the p-channel load device implementation. The load currents in transistors 26 and 34 are determined by the currents through bipolar transistors 20 and 30, respectively, the sum of which is determined by the current available from the current source path formed by switching transistor 22 and current source transistor 23. It will be appreciated that because transistor 23 is controlled by $V_{bias}$ supplied by the load current control circuit, $V_{bias}$ will control current flow in p-channel load devices 26 and 34, and therefore will control the output voltage of the sense amplifier.

The sense amplifier, as in FIGS. *2a* and *2b* above, has two inputs 205 and 206, which are connected to receive one of the complementary low-level logic signals of the system employing the present invention. Inputs 205 and 206 are terminated by a pair of voltage clamps 29 and 32. Clamp 29 is formed by an npn bipolar transistor, with its collector and gate tied to $V_{cc}$, and its emitter receiving one low-level logic signal through input 205. The other clamp 32 is formed by an npn bipolar transistor, with its collector and gate tied to $V_{cc}$, and its emitter receiving the complementary low-level logic signal through input 206. A p-channel transistor 24 serves as a high impedance link between inputs 205 and 206 to prevent the emitters of clamps 29 and 32 from floating up relative to the other input. The sense amplifier also has two outputs 215 and 216. The collector of transistor 20 is coupled to output 216, providing one high-level logic signal output. The collector of transistor 30 is coupled to output 215, forming the complementary high-level logic signal output. The collectors of transistors 20 and 30 have associated with each of them a parasitic capacitance shown in FIG. 4 as capacitors 36 and 21 respectively. The parasitic capacitances are attributed to the physical structure of the transistors forming the sense amplifier and loads.

In operation, the sense amplifier as formed by transistors 20 and 30 functions as a conventional differential amplifier known in the art. Input signals "in" and "in-bar" coupled respectively to transistors 20 and 30 cause currents to flow in each load device 26 and 34, the relative magnitude of each current being determined by the current source transistor 23, and by the level difference between the base voltages applied to transistors 20 and 30. The current flowing in load devices 26 and 34 produces a voltage drop across transistors 26 and 34 respectively. The voltage across each load device 26 and 34 is the respective input signal amplified corresponding to the current flow sourced by transistor 23 whose gate drive is controlled by $V_{bias}$. The output signals of the sense amplifier are shown in FIG. 4 as "out" and "out-bar", as measured on the drains of transistors 26 and 34. The "out" and "out-bar" signals thus comprise the amplified input signals "in" and "in-bar". The voltage levels to which "out" and "out-bar" may swing are determined and limited by the $V_{bias}$ supplied by the load current controller. $V_{bias}$ controls the gate drive of current source transistor 23, with the voltage swing between "out" and "out-bar" constrained from $V_{cc}$ to $V_{cc}-V_{be}$. As the current sourced by transistor 23 increases, the voltage drop across loads 26 and 34 increases, producing the amplified logic signals.

The principal advantage of the present invention over the prior art is that the load current controller will supply the $V_{bias}$ necessary to maintain the output swing from $V_{cc}$ to $V_{cc}-V_{be}$, and no more, without the need for obtrusive high-capacitance voltage limiters and/or speed-robbing feedback circuits. The differential amplifier can operate essentially unhindered from such devices because the voltage swing is controlled by an independent but identical circuit. Thus, the output swing of the differential amplifier remains $V_{cc}$ to $V_{cc}-V_{be}$ regardless of the temperature, supply voltage, or processing history of the circuit.

The foregoing has described a high speed bi-CMOS differential amplifier with controlled voltage swing. It is contemplated that changes and modifications may be made by one of ordinary skill in the art, to the materials and arrangements of elements of the present invention without departing from the spirit and scope of the invention.

I claim:

1. A high speed differential amplifier with controlled output voltage swing for amplifying low-level complementary logic signals, said differential amplifier comprised of:

a) at least one sense amplifier containing a pair of load devices, said sense amplifier further having a first, second, third and fourth input, and a first and second output, said first input coupled to receive a first low-level logic signal, said second input coupled to receive a second low-level logic signal complementary to said first low-level logic signal, said third input coupled to receive a bias voltage from a load current control means for controlling the output voltage swing of said sense amplifier, and said fourth input coupled to receive an externally sourced enable signal, b) a load current control means for simulating said load devices in said amplifier, said load control means having a first input coupled to receive a reference swing voltage, a second input coupled to receive a simulated load voltage from a simulated load which simulates said load devices in the differential amplifier, and an output, said reference swing voltage comprising a desired voltage difference between a given high-level logic signal and its complementary high-level logic signal, said simulated load voltage comprising the voltage drop across a device geometrically similar to said load in the high speed differential amplifier, said load current control means comparing said simulated load voltage to said reference swing voltage and producing an output bias voltage corresponding to when the simulated voltage drop across said simulated load equals said reference swing voltage;

said sense amplifier increasing said first and second low-level logic input signals to an amplified first and second high-level logic signals, said bias voltage controlling current flow in said load devices so that the output voltage swing of said first and second high-level logic signals is equal to said reference swing voltage, said first and second high-level logic signals comprising the controlled output swing of the differential amplifier.

2. The high speed differential amplifier as set forth in claim 1, wherein the simulated load of the load current control means comprises a p-channel transistor.

3. The high speed differential amplifier as set forth in claim 1, wherein the reference swing voltage of the load current control means comprises a closed loop feed forward reference voltage.

4. The high speed differential amplifier as set forth in claim 1, wherein the reference swing voltage of the load current control means comprises a bipolar transistor.

5. The high speed differential amplifier as set forth in claim 1, wherein the reference swing voltage of the load current control means comprises $V_{be}$ of said bipolar transistor.

6. The high speed differential amplifier as set forth in claim 1, wherein the reference swing voltage of the load current control means comprises 0.7 volts.

7. A high speed differential amplifier as set forth in claim 1, wherein the load current control means uses the base-emitter voltage of a bipolar transistor to generate the swing voltage reference.

8. A high speed differential amplifier as set forth in claim 1, wherein the circuit path of the simulated load of the load current control means duplicates the sense amplifier load devices.

9. A high speed differential amplifier as set forth in claim 1, wherein the load current controller circuit path containing said simulated load duplicates in the sense amplifier circuit path.

10. A high speed differential amplifier as set forth in claim 1, wherein the differential amplifier is comprised of a simulated sense amplifier controlling a sense amplifier.

11. A high speed differential amplifier as set forth in claim 1, wherein a load current control means sets the output voltage swing of at least one differential sense amplifier.

12. A high speed differential amplifier as set forth in claim 1, wherein the load current control means generates a bias voltage corresponding to the current flow through a simulated load device producing a desired voltage across the simulated load.

13. A high speed differential amplifier as set forth in claim 1, wherein the load current control means comprises a differential pair to compare a reference voltage against a voltage drop across a simulated load.

14. A high speed differential amplifier as set forth in claim 1, wherein said differential amplifier will not saturate.

15. A high speed differential amplifier with controlled output voltage swing for amplifying low-level complementary logic signals, said differential amplifier comprising:

- a sense amplifier means for amplifying a first and second low-level logic signals, said second low-level logic signal being complementary to said first low-level logic signal, said sense amplifier means further comprising,
  - a first and second inputs coupled to receive, respectively, said first and second low-level logic signals,
  - a third input coupled to receive said bias voltage from the load current control means,
  - a fourth input coupled to receive an externally sourced enable signal,
  - a first and second loads, and
  - a first and second outputs, and
- a load current control means for controlling current flow in a simulated load device simulating said first and second loads and producing an output bias voltage, said load current control means further comprising;
  - a reference swing voltage means for producing a reference swing voltage;
  - a simulated load for producing a simulated load voltage corresponding to the current flow in the simulated load;
  - a first differential amplifier having a first input coupled to receive said reference swing voltage, a second input coupled to receive said simulated load voltage, and an output,
    - said first differential amplifier comparing said reference swing voltage and said simulated load voltage and producing an output reference difference,
  - a scaling means, having an input coupled to receive the reference difference of said first differential amplifier and an output, for producing a scaled current and voltage corresponding to the voltage across said simulated load, and
  - a voltage clamp having an input coupled to said scaling means and an output, said voltage clamp limiting the scaled voltage of said scaling means and producing said output bias voltage of said load current control means;

said bias voltage controlling the current flow of said first and second low-level logic signals in said first and second loads respectively, the voltage corresponding to said controlled current flow in said first and second load comprising amplified first and second high-level controlled logic signals, said first and second high-level logic signals comprising said controlled output swing and appearing at said first and second outputs of said sense amplifier means is limited to said reference swing voltage.

16. The high speed differential amplifier as set forth in claim 15, wherein said sense amplifier means comprises at least one sense amplifier controlled by said load current control means.

17. The high speed differential amplifier as set forth in claim 15, wherein the simulated load is comprised of a p-channel transistor.

18. The high speed differential amplifier as set forth in claim 15, wherein the reference swing voltage means is comprised of a bipolar transistor.

19. The high speed differential amplifier as set forth in claim 15, wherein the reference swing voltage of the load current control means comprises a closed loop feed forward reference voltage.

20. The high speed differential amplifier as set forth in claim 15, wherein the reference swing voltage of the load current control means comprises $V_{be}$ of said bipolar transistor.

21. The high speed differential amplifier as set forth in claim 15, wherein the reference swing voltage of the load current control means comprises 0.7 volts.

22. The high speed differential amplifier as set forth in claim 15, wherein first and second loads comprise first and second p-channel transistors respectively, each having a drain, a source and a gate.

23. The high speed differential amplifier as set forth in claim 15, wherein the simulated load is comprised of a p-channel transistor with a channel length equal to the channel length of said loads.

24. The high speed differential amplifier as set forth in claim 22 wherein the sources of said first and second p-channel transistors are connected to a circuit supply voltage, the gates of said first and second p-channel transistors are connected to ground, the drain of said first p-channel transistor is coupled to said first output of said sense amplifier means, and the drain of said second p-channel transistor is coupled to said second output of said sense amplifier, said first and second p-channel transistors operating as linear resistors.

25. A high speed differential amplifier as set forth in claim 15, wherein said differential amplifier will not saturate.

26. A high speed differential amplifier with controlled output voltage swing for amplifying low-level complementary logic signals, said differential amplifier comprised of:

an emitter-coupled differential pair comprised of a first and second bipolar transistors;

a bipolar reference transistor for producing a reference swing voltage of magnitude $V_{be}$ equal to the base-emitter voltage, the emitter of said reference transistor connected to the base of said first transistor of the emitter-coupled differential pair;

a simulated load comprised of a p-channel transistor for producing a simulated load voltage corresponding to the current flowing in the simulated load, said simulated load connected to the base of said second bipolar transistor of said emitter-coupled differential pair;

a voltage clamp;

a current mirror comprised of a first and second p-channel transistors for producing a scaled current and voltage corresponding to the voltage drop across said simulated load, the drain of said second p-channel transistor comprising an input of said current mirror and connected to the collector of said second bipolar transistor of said emitter-coupled differential pair, and the drain of the first p-channel transistor comprising an output of said current mirror and connected to said voltage clamp, the difference between said reference swing voltage and said simulated load voltage appearing at the collector of said second transistor of said emitter-coupled pair and at the input of said current mirror, said scaled current and voltage corresponding to the voltage drop across said simulated load, said voltage clamp limiting said scaled voltage, the voltage-limited output of said voltage clamp comprising a desired bias voltage;

an externally controlled enable switch comprised of an n-channel transistor, the gate of said enable switch driven by an enabling signal;

a current source comprised of an n-channel transistor, the gate of said current source driven by said bias voltage; and at least one sense amplifier for amplifying a first and second low-level logic signals, said second low-level logic signal complementary to said first low-level logic signal, said sense amplifier comprised of a third and fourth bipolar transistors comprising an emitter coupled differential pair, said sense amplifier connected to receive a first and second low-level logic signals, said second low-level logic signal complementary to said first low-level logic signal, and the emitters of said third and fourth bipolar transistors switchably connected by said enable switch to said current source, and a first and second loads comprised of p-channel transistors connected, respectively, to said third and fourth bipolar transistors, said bias voltage controlling the current flow of said first and second low-level logic signals in said first and second loads respectively, the voltage corresponding to said controlled current flow in said first and second load comprising amplified first and second high-level controlled logic signals, said first and second high-level logic signals comprising said controlled output swing and appearing at said first and second outputs of said sense amplifier means is limited to said reference swing voltage.

27. The high speed differential amplifier as set forth in claim 26, wherein the channel length of the simulated load is equal to the channel length of said first and second loads.

28. A high speed differential amplifier as set forth in claim 26, wherein said differential amplifier will not saturate.

29. A method for controlling the output voltage swing of a high speed differential amplifier for amplifying low-level complementary logic signals, said method comprised of the following steps:

providing a load current control means having a first input coupled to receive a reference swing voltage, a second input coupled to receive a simulated load voltage from a simulated load, and an output, said load current control means comparing said simulated load voltage to said reference swing voltage and producing an output bias voltage corresponding to when the simulated voltage drop across said simulated load equals said reference swing voltage; and providing a sense amplifier having a first, second, third and fourth input, and a first and second output, said first input coupled to receive a first low-level logic signal, said second input coupled to receive a second low-level logic signal complementary to said first low-level logic signal, said third input coupled to receive said bias voltage for controlling the output voltage swing of said sense amplifier, and said fourth input coupled to receive an externally sourced enable signal, said sense amplifier increasing said first and second low-level logic input signals to an amplified first and second high-level logic signals, said bias voltage controlling said sense amplifier so that the output voltage swing of said first and second high-level logic signals is equal to said reference swing voltage, said first and second high-level logic signals comprising the controlled output swing of the differential amplifier.

30. A method for controlling the output voltage swing of a high speed differential amplifier for amplifying low-level complementary logic signals, said method comprised of the following steps:

providing an emitter-coupled differential pair comprised of a first and second bipolar transistors;

producing a reference swing voltage from a bipolar reference transistor, said reference swing voltage of magnitude $V_{be}$ equal to the base-emitter voltage, the emitter of said reference transistor connected to the base of said first transistor of the emitter-coupled differential pair;

producing a simulated load voltage from a simulated load comprised of a p-channel transistor, said simulated load voltage corresponding to the current flowing in the simulated load, said simulated load connected to the base of said second bipolar transistor of said emitter-coupled differential pair;

providing a voltage clamp;

scaling the current and voltage corresponding to the voltage drop across said simulated load in a current mirror, said current mirror comprised of a first and second p-channel transistors, the drain of said second p-channel transistor comprising an input of said current mirror and connected to the collector of said second bipolar transistor of said emitter-coupled differential pair, and the drain of the first p-channel transistor comprising an output of said current mirror and connected to said voltage clamp, the difference between said reference swing voltage and said simulated load voltage appearing at the collector of said second transistor of said emitter-coupled pair and at the input of said current mirror, said scaled current and voltage corresponding to the voltage drop across said simulated load, said voltage clamp limiting said scaled voltage, the voltage-limited output of said voltage clamp comprising a desired bias voltage;

providing an externally controlled enable switch comprised of an n-channel transistor, the gate of said enable switch driven by an enabling signal;

providing a current source comprised of an n-channel transistor, the gate of said current source driven by said bias voltage; and amplifying in a sense amplifier a first and second low-level logic signals, said second low-level logic signal complementary to said first low-level logic signal, said sense amplifier comprised of a third and fourth bipolar transistors comprising an emitter coupled differential pair, said sense amplifier connected to receive a first and second low-level logic signals, said second low-level logic signal complementary to said first low-level logic signal, and the emitters of said third and fourth bipolar transistors switchably connected by said enable switch to said current source, and a first and second loads comprised of p-channel transistors connected, respectively, to said third and fourth bipolar transistors, said bias voltage controlling the current flow of said first and second low-level logic signals in said first and second loads respectively, the voltage corresponding to said controlled current flow in said first and second load comprising amplified first and second high-level controlled logic signals, said first and second high-level logic signals comprising said controlled output swing and appearing at said first and second outputs of said sense amplifier means is limited to said reference swing voltage.

31. A method for controlling the output voltage swing of a high speed differential amplifier for amplifying low-level complementary logic signals, said method comprised of the following steps:

providing an emitter-coupled differential pair;

producing a reference swing voltage;

producing a simulated load voltage from a simulated load, said simulated load voltage corresponding to the current flowing in the simulated load;

providing a voltage clamp;

producing in a current mirror a scaled current and scaled voltage corresponding to the simulated voltage drop across said simulated load, said emitter-coupled pair producing a voltage difference between said reference swing voltage and said simulated load voltage, said voltage difference causing said current mirror to produce said scaled current and voltage, said voltage clamp limiting said scaled voltage, the voltage-limited scaled voltage of said voltage clamp comprising a desired bias voltage;

providing a current source; and amplifying in a sense amplifier a first and second low-level logic signals, said second low-level logic signal complementary to said first low-level logic signal, said sense amplifier further having a first and second loads, said bias voltage controlling the current flow of said first and second low-level logic signals in said first and second loads respectively, the voltage corresponding to said controlled current flow in said first and second load comprising amplified first and second high-level controlled logic signals, said first and second high-level logic signals comprising said controlled output swing, said controlled output swing limited to said reference swing voltage.

32. The method as set forth in claim 30, wherein said reference swing voltage is supplied by a bipolar transistor.

33. The method as set forth in claim 32, wherein said reference swing voltage is $V_{be}$ of said bipolar transistor.

34. The method as set forth in claim 32, wherein said reference swing voltage is 0.7 volts.

35. The method as set forth in claim 32, wherein a simulated load voltage is used to limit the output swing voltage of a sense amplifier.

* * * * *